United States Patent
Huang et al.

(10) Patent No.: US 6,403,416 B1
(45) Date of Patent: Jun. 11, 2002

(54) METHOD FOR MAKING A DOUBLE-CYLINDER-CAPACITOR STRUCTURE FOR DYNAMIC RANDOM ACCESS MEMORY (DRAM)

(75) Inventors: Kuo Ching Huang, Kaohsiung; Yu-Hua Lee, Hsinchu; James (Cheng-Ming) Wu, Kao-Hsiung; Wen-Chuan Chiang, Hsin-Chu, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/226,279

(22) Filed: Jan. 7, 1999

(51) Int. Cl.[7] .......................................... H01L 21/8242

(52) U.S. Cl. ...................... 438/241; 438/253; 438/396

(58) Field of Search ................................ 438/241, 253, 438/396, FOR 212, FOR 430; 148/DIG. 14

(56) References Cited

U.S. PATENT DOCUMENTS

| | | | |
|---|---|---|---|
| 5,084,405 A | * | 1/1992 | Fazan et al. |
| 5,266,512 A | | 11/1993 | Kirsch |
| 5,399,518 A | | 3/1995 | Sim et al. |
| 5,545,582 A | | 8/1996 | Roh |
| 5,700,709 A | * | 12/1997 | Park et al. |
| 5,712,202 A | | 1/1998 | Liaw et al. |
| 5,759,892 A | | 6/1998 | Wang et al. |
| 5,933,742 A | * | 8/1999 | Wu |
| 6,030,866 A | * | 2/2000 | Choi |

OTHER PUBLICATIONS

Wolf, Stanley. Silicon Processing for the VLSI Era, vol. 1 Process Technology, p. 534, Aug. 1986.*
Wolf, Stanley. Silicon Prcoessing for the VLSI Era, vol. 1 Process Technology. Lattice Press, Sunset Beach, California, p. 534, Aug. 1986.*

* cited by examiner

Primary Examiner—George Fourson
Assistant Examiner—Michelle Estrada
(74) Attorney, Agent, or Firm—George O. Saile; Stephen B. Ackerman

(57) ABSTRACT

A method using a single masking step for making double-cylinder stacked capacitors for DRAMs which increases capacitance while eliminating erosion of an underlying oxide insulating layer when the masking step is misaligned is described. A planar silicon oxide ($SiO_2$) first insulating layer is formed over device areas, and a first silicon nitride ($Si_3N_4$) etch-stop layer is deposited, and openings are etched for capacitor node contacts. A first polysilicon layer is deposited to a thickness sufficient to fill the openings and to form an essentially planar surface. A second insulating layer is deposited and patterned to form portions with vertical sidewalls over the node contacts. A conformal second $Si_3N_4$ layer is deposited and etched back to form spacers on the vertical sidewalls, and the first polysilicon layer is etched to the first $Si_3N_4$ layer. The second insulating layer is selectively removed using HF acid while the first polysilicon and first $Si_3N_4$ layers prevent etching of the underlying first $SiO_2$ layer. A second polysilicon layer is deposited and etched back to form double-cylinder sidewalls for the capacitor bottom electrodes. The first and second $Si_3N_4$ layers are removed in hot phosphoric acid. The capacitors are completed by forming an interelectrode dielectric layer on the bottom electrodes, and depositing a third polysilicon layer for top electrodes.

22 Claims, 8 Drawing Sheets

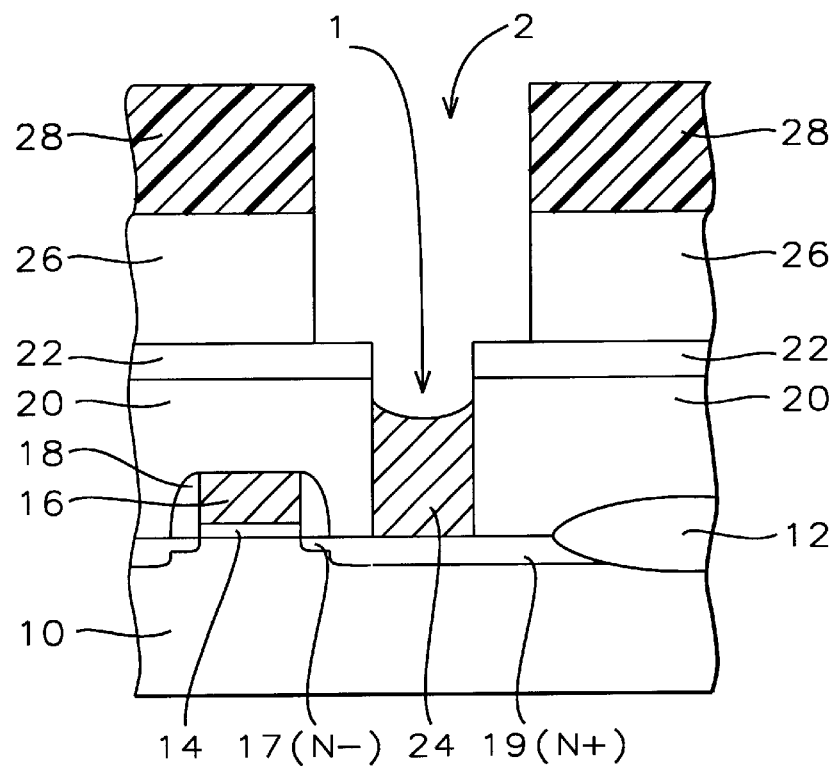
FIG. 1 – Prior Art
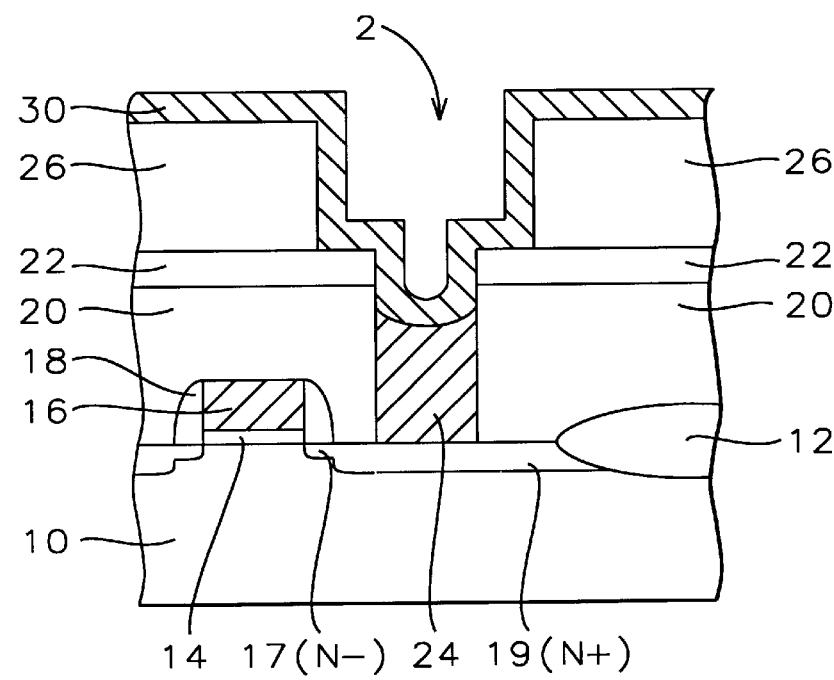
FIG. 2 – Prior Art

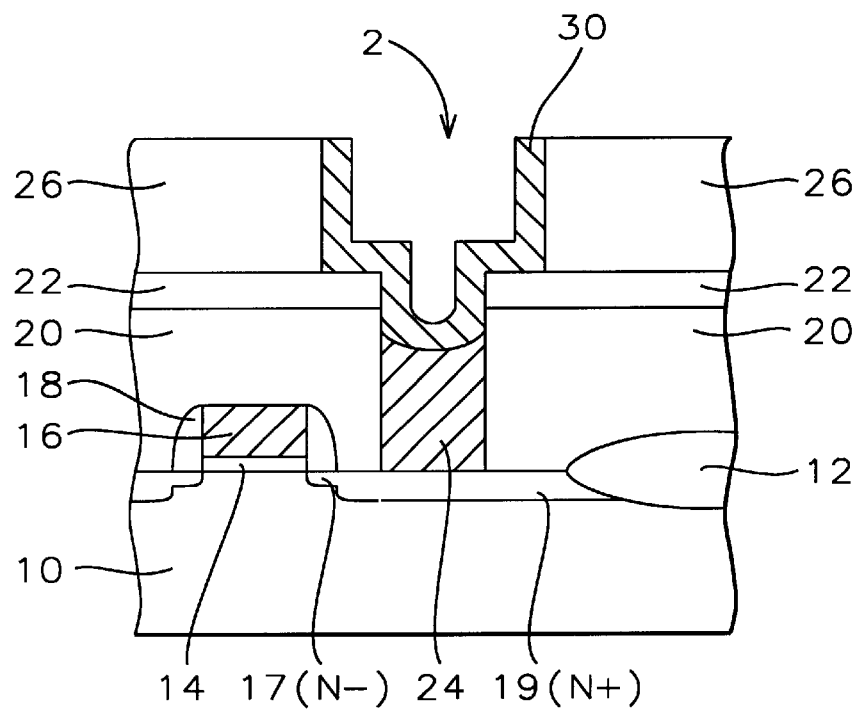
FIG. 3 - Prior Art
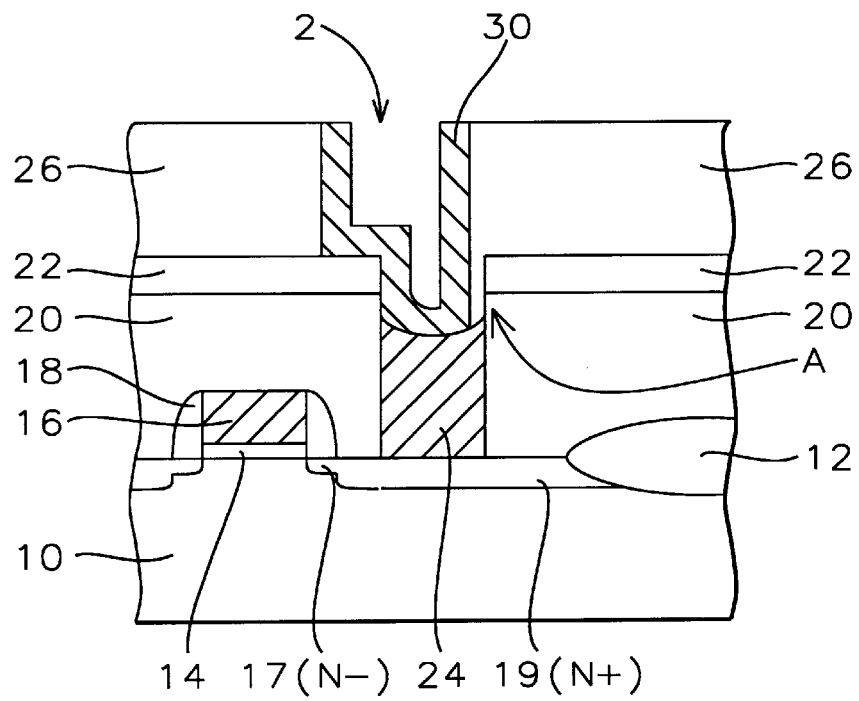
FIG. 4 - Prior Art

METHOD FOR MAKING A DOUBLE-CYLINDER-CAPACITOR STRUCTURE FOR DYNAMIC RANDOM ACCESS MEMORY (DRAM)

BACKGROUND OF THE INVENTION (1) Field of the Invention

The present invention relates to the fabrication of dynamic random access memory (DRAM) devices, and more particularly to a method for fabricating stacked storage capacitors with increased capacitance for DRAM cells. The method allows for greater misalignment tolerances during processing, and therefore provides a larger process window. A minimal number of additional process steps is required over the more conventional capacitor process to minimize manufacturing cost, and is easily integrated into the DRAM process.

(2) Description of the Prior Art

Ultra Large Scale Integration (ULSI) technologies have dramatically increased the circuit density on the semiconductor chip. This increase in density is due in part to advances in high-resolution photolithography and anisotropic plasma etching in which the directional ion etching results in essentially bias-free replication of the photoresist image in the underlying patterned layers, such as in polysilicon and insulating oxide layers and the like.

One such circuit type where this high-resolution processing is of particular importance is the dynamic random access memory (DRAM) circuit. This DRAM circuit is used extensively in the electronics industry, and particularly in the computer industry for electrical data storage. The DRAM circuit consists of an array of individual memory cells, each cell consisting of a single access transistor, usually a field effect transistor (FET), and a single storage capacitor. Information is stored on the cell as charge on the capacitor, which represents a unit of data (bit), and is accessed by read/write circuits on the periphery of the DRAM chip.

There are numerous methods reported in the literature for making DRAM circuits with stacked capacitors that increase capacitance. For example, Kirsch, in U.S. Pat. No. 5,266,512, teaches a method for making a nested surface capacitor to improve memory cell density, while Sim et al., U.S. Pat. No. 5,399,518, describe a method for multiple walled capacitor to also increase capacitance and improve memory cell density. Liaw et al., U.S. Pat. No. 5,712,202, also teach a method for making a double or triple or higher walled-cylindrical capacitor of a semiconductor memory device. Roh, in U.S. Pat. No. 5,545,582, also teaches a method for making a device capacitor to increase capacitance.

However, in recent years the price of DRAM chips has dropped dramatically. Therefore there is a strong need to make a simple DRAM chip that is manufacturing cost effective.

However, the above patents do not address the problem when alignment tolerances become critical with reduced feature sizes, and misalignment problems can occur.

One method of making a simple low-cost DRAM capacitor by the prior art is depicted in FIGS. 1 through 4. To achieve a high density of memory cells on a DRAM chip is to form a capacitor node contact to one of the source/drain areas of the FET in each of the memory cells, and then to form a bottom electrode aligned over the node contact. In the next generation of semiconductor technology, the minimum feature sizes will be 0.25 micrometers or less. At these feature sizes, misalignment of the bottom electrode to the node contact can result in processing and reliability problems. The problem is best illustrated in the prior art depicted in FIGS. 1 through 4. FIG. 1 shows a typical memory cell area on a substrate 10 surrounded and electrically isolated by field oxide regions 12, and having a silicon oxide ($SiO_2$) first insulating layer 20 and a silicon nitride ($Si_3N_4$) etch-stop layer 22. A patterned photoresist mask (not shown) and plasma etching are used to etch first openings 1 in layers 22 and 20 for node contacts. A doped first polysilicon layer 24 is deposited and etched back to form the capacitor node contact 24 in opening 1. Because of variations in etch rate uniformities across the substrate, and because of nonuniformity in the polysilicon deposition, it is necessary to overetch for forming the polysilicon plugs for the node contacts to ensure that all the polysilicon is removed from the surface of the etch-stop layer 22. This results in recessed polysilicon plugs that expose the sidewalls of the first insulating layer 20. A disposable second insulating layer 26 is deposited, and a second photoresist mask 28 and plasma etching are used to etch second openings 2 in layer 26 for forming the capacitor bottom electrodes, as shown in FIG. 1.

Referring to FIG. 2, a conformal second polysilicon layer 30 is deposited and, as shown in FIG. 3, is polished back to form the capacitor bottom electrode 30. The second insulating layer 26 is then removed to leave portions of the second polysilicon layer 30 to form capacitor bottom electrodes.

However, as shown in FIG. 4, when the photoresist 28 for making the second opening 2 is misaligned, the first insulating layer 20 in the sidewalls at point A of the node contact opening 1 are exposed to the wet etch (hydrofluoric acid) that is used to remove the second insulating layer 26. The erosion of the first insulating layer 20 results in unreliable DRAM devices.

One method of circumventing the misalignment problem is described by Wang et al., U.S. Pat. No. 5,759,892, in which polysilicon sidewall spacers are formed in the node contact openings over the polysilicon plug. This prevents unwanted etching of the underlying insulating layer during processing when the capacitor bottom electrode is misaligned over the polysilicon plug, but this method does not further increase the capacitance over the other prior art.

Therefore, there is still a need to make DRAM device with increased capacitance using a simple cost-effective process that does not significantly increase the DRAM price.

SUMMARY OF THE INVENTION

A principal object of this present invention is to provide a method for making improved double-cylinder-shaped stacked capacitors for DRAM memory cells having increased capacitance.

It is another object of this invention to provide a method that is less susceptible to underlying silicon oxide damage over the device areas during misalignment of a photoresist mask.

Still another object of this invention is to provide a process for making a capacitor structure that is easily integrated into the DRAM cell process with minimal increase in processing complexity and manufacturing cost.

The invention begins by providing a semiconductor substrate (wafer) composed of single crystalline silicon. The details for the semiconductor devices in the substrate are not described in detail since they are not essential to understanding the invention. But typically the memory cells on a substrate for DRAM circuits have device areas surrounded and electrically isolated by field oxide (FOX) regions, and semiconductor devices for the memory devices are typically field effect transistors (FETs). The double-cylinder-shape storage capacitor, by the method of this invention, is then formed over each of the memory cell areas and electrically contacts (node contacts) one of the two source/drain areas of each FET.

Continuing with the process, a first insulating layer is deposited over the device areas on the substrate, and is planarized, for example by chemical-mechanical polishing. The first insulating layer is a silicon oxide ($SiO_2$) or a doped oxide such as a borophosphosilicate glass (BPSG). A first silicon nitride ($Si_3N_4$) layer is deposited as an etch-stop layer on the first $SiO_2$ insulating layer. Contact openings for capacitor node contacts are etched in the first $Si_3N_4$ layer and in the first insulating layer to the device areas. A conformal conductively doped first polysilicon layer is deposited to a thickness sufficient to fill the contact openings and to form an essentially planar surface over the contact openings. A second insulating layer composed of $SiO_2$ is deposited on the planar surface of the first polysilicon layer. A photoresist mask and anisotropic plasma etching are used to pattern the second insulating layer, leaving portions of the $SiO_2$ layer aligned over the node contact openings and exposing the first polysilicon layer elsewhere on the substrate. An important feature of this invention is that even if the patterned $SiO_2$ layer is misaligned over the contact openings, the first polysilicon layer prevents overetching the underlying $SiO_2$ first insulating layer in the node contact openings, as would occur in the process sequence of the prior art (FIGS. 1–4). Next a conformal second $Si_3N_4$ layer is deposited over the patterned second insulating layer, and is anisotropically etched back to form sidewall spacers on the patterned second insulating layer, and the etching is continued to remove the first polysilicon layer down to the first $Si_3N_4$ layer. The exposed portions of the second insulating layer are then selectively removed in a hydrofluoric acid etch to leave free-standing $Si_3N_4$ sidewall spacers, while the first $Si_3N_4$ layer protects the $SiO_2$ first insulating layer from etching. A conformal doped second polysilicon layer is deposited and anisotropically etching back to form double-cylinder-shaped polysilicon sidewalls, one on each side of the $Si_3N_4$ sidewall spacers, while exposing the top surface of the $Si_3N_4$ sidewall spacers. The second and first $Si_3N_4$ layers are selectively removed in a hot phosphoric acid to form free-standing capacitor bottom electrodes formed from the second and first polysilicon layers. By laterally etching the first $Si_3N_4$ layer under the bottom electrodes, the capacitor area is increased, further increasing capacitance. Also, a portion of the first $Si_3N_4$ layer can be retained to provide additional support for the polysilicon capacitor structure. A thin interelectrode dielectric layer, having a high dielectric constant, is deposited on the capacitor bottom electrodes. A doped third polysilicon layer is deposited and patterned to form top electrodes to complete the double-cylinder-shaped stacked capacitors for the DRAM cells.

BRIEF DESCRIPTION OF THE DRAWINGS

The objects and other advantages of this invention are best understood in the preferred embodiment with reference to the attached drawings, which are now briefly described.

FIGS. 1 through 4 are schematic cross-sectional views showing the sequence of process steps for a prior-art DRAM cell when misalignment occurs.

DESCRIPTION OF THE PREFERRED EMBODIMENT

In keeping with the objects of the present invention, the method for forming these improved double-cylinder-shaped storage capacitors is covered in detail. These improved capacitors can be used on DRAM circuits having FET structures that are currently utilized in the manufacture of DRAMs. Therefore, only those details of the underlying substrate structure that are necessary for understanding the current invention for making these improved capacitors will be described. It should also be well understood by those skilled in the art that by including additional processing steps, other types of devices can also be included on the DRAM chip. For example, by providing N and P doped wells, both P-channel and N-channel FETs can be formed for fabricating CMOS circuits, as are commonly used in the peripheral circuits of the chip.

Figure 5:
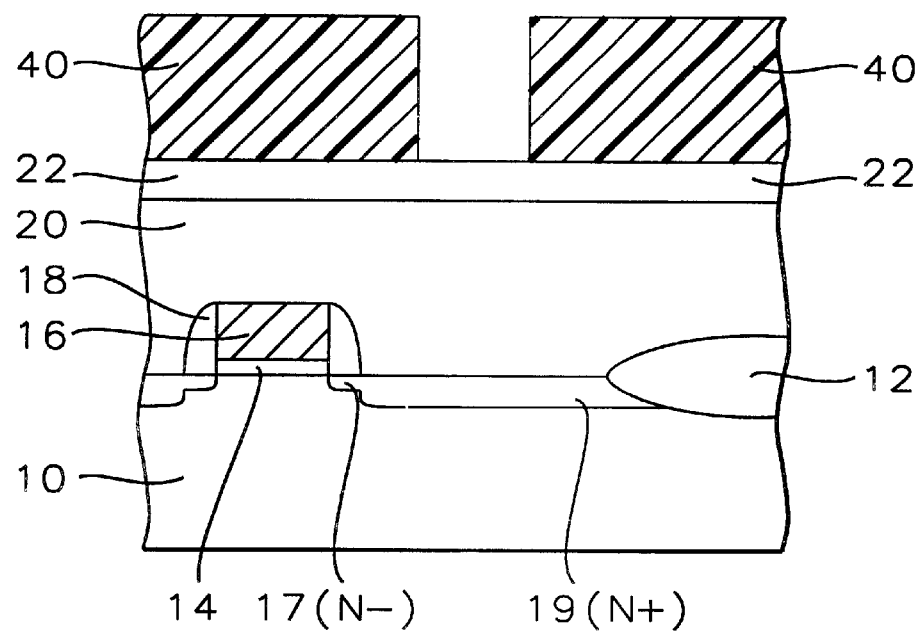
FIGS. 5 through 16 are schematic cross-sectional views showing the sequence of process steps for making an improved DRAM cell with a double-cylinder-shaped capacitor, by the method of this invention, which increases capacitance and prevents oxide erosion if misalignment occurs.

Referring now to FIG. 5, a cross-sectional view is shown of a portion of a substrate 10 having a partially completed DRAM cell. The preferred substrate is composed of a P-type single-crystal silicon with a <100> crystallographic orientation. The details for the semiconductor devices in and on the substrate are explicitly depicted in the drawings but are not described in detail since they are fabricated as commonly practiced in the industry and are not essential for understanding the invention. The memory cells on a substrate for DRAM circuits typically have device areas surrounded and electrically isolated by field oxide (FOX) regions 12. Typically the FOX 12 is formed by the local oxidation of silicon (LOCOS), as commonly practiced in the industry. Alternatively, for higher density circuits a shallow trench isolation (STI) can be used in which trenches are etched in the substrate 10 and filled with an insulating material such as silicon oxide ($SiO_2$). For the purpose of this invention, the FOX formed by the LOCOS method is shown in the drawings. Next, N-channel field effect transistors (FETs) are formed in the device areas by first growing a thermal oxide on the device areas to form a gate oxide 14. A polysilicon layer 16, doped $N^+$ with phosphorus or arsenic, is deposited and patterned to form the FET gate electrodes, also labeled 16. Alternatively, a polysilicon/metal silicide layer can be used for the FET gate electrodes to improve electrical conductivity. Lightly doped source/drain areas 17($N^-$) are formed, for example by ion implanting phosphorus ($p^{31}$) or arsenic ($As^{75}$) ions, adjacent to the FET gate electrodes 16 to minimize short-channel effects. Insulating sidewall spacers 18 are formed on the sidewalls of the gate electrodes 16 by depositing a conformal insulating layer, such as $SiO_2$ or $Si_3N_4$, and anisotropically etching back to the substrate surface. Heavily doped source/drain contact areas 19($N^+$) are then formed, also by implanting $p^{31}$ or $As^{75}$ ions, adjacent to the sidewall spacers 18 to provide low-resistance contacts for bit lines (which are not shown) and for the capacitor node contacts of this invention.

Referring still to FIG. 5, the double-cylinder stacked storage capacitor is then formed over each of the memory cell areas. Only one of the array of capacitors is depicted in the drawing. A first insulating layer 20 is deposited to insulate the semiconductor devices on the substrate 10. Layer 20 is preferably $SiO_2$, and is deposited using low-pressure chemical vapor deposition (LPCVD) and a reactant gas such as tetraethosiloxane (TEOS). Alternatively, layer 20 can be a borophosphosilicate glass (BPSG) deposited by LPCVD using TEOS, and is doped with boron and phosphorus during the silicon oxide deposition. The first insulating layer 20 is then planarized. For example, layer 20 can be planarized using chemical-mechanical polishing (CMP) to provide global planarization. Alternatively, if a BPSG is used, the layer can be leveled by thermal annealing. The thickness of the first insulating layer 20 after planarizing is preferably between about 4000 and 6000 Angstroms over the underlying semiconductor devices (FETs) on the substrate 10. A first $Si_3N_4$ layer 22, which serves as an etch-stop layer, is deposited on layer 20. Preferably layer 22 is deposited by LPCVD using, for example, dichlorosilane ($SiCl_2H_2$) and ammonia ($NH_3$) as the reactant gases. The first $Si_3N_4$ layer 22 is deposited to a preferred thickness of between about 100 and 300 Angstroms. Conventional photolithographic techniques are used to pattern a photoresist layer 40 for etching node contact openings.

Figure 6:
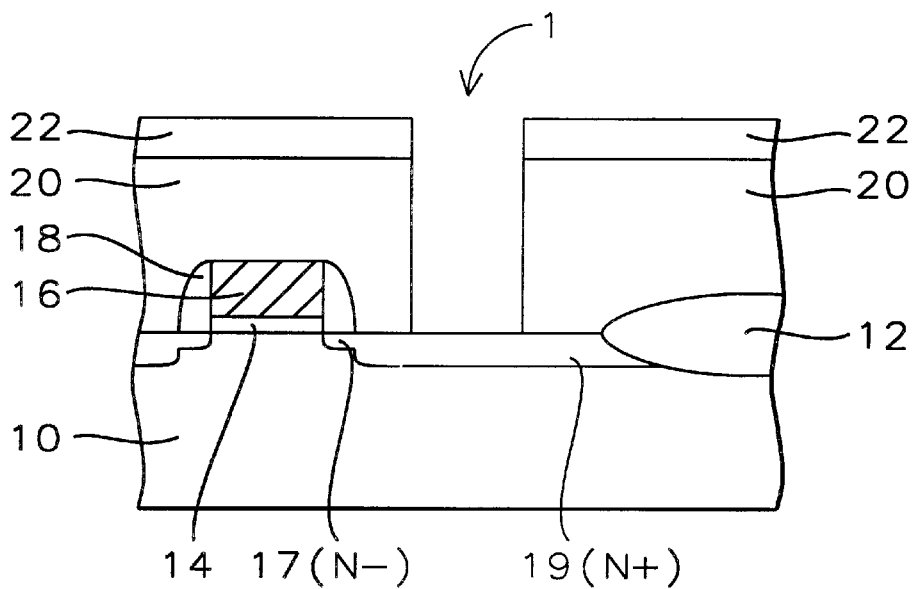

Referring to FIG. 6, the node contact openings 1 are etched in the first $Si_3N_4$ layer 22 and the first insulating layer 20 to the source/drain contact areas 19($N^+$) using anisotropic plasma etching. For example, the etching can be carried out in a high-density plasma (HDP) etcher using an etchant gas that has a high etch-rate selectivity of $SiO_2$ to silicon, such as carbon tetrafluoride ($CF_4$), trifluoromethane ($CHF_3$), nitrogen ($N_2$), and argon (Ar) as the carrier gas. The photoresist mask 40 is then removed, for example, by plasma ashing in oxygen ($O_2$).

Figure 7:
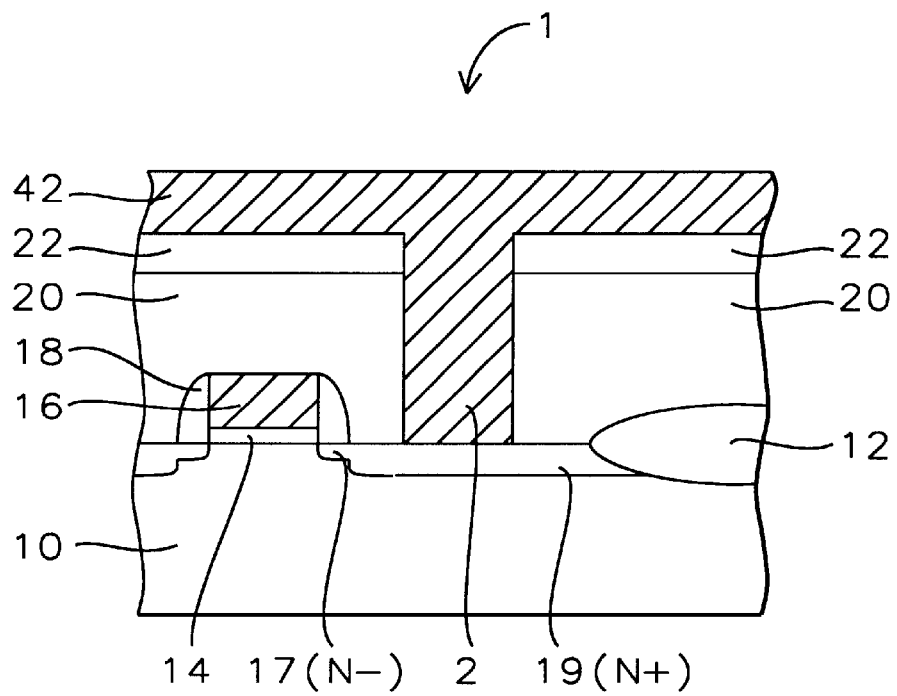

Referring to FIG. 7, a conformal first polysilicon layer 42 is deposited over the first $Si_3N_4$ layer 22 and in the node contact openings 1. The polysilicon layer 42 is preferably deposited by LPCVD using, for example, silane ($SiH_4$) as the reactant gas, and is in-situ doped with an N type dopant such as phosphorus to a concentration of between 1.0 E 19 and 1.0 E 21 atoms/cm$^3$. Layer 42 is deposited to a thickness sufficient to fill the first contact openings 1 and to form a planar surface and to provide node contacts 2 in the openings 1 for the capacitors. More specifically polysilicon layer 42 is deposited to a thickness of between about 1000 and 3000 Angstroms over the first $Si_3N_4$ layer 22.

Figure 8:
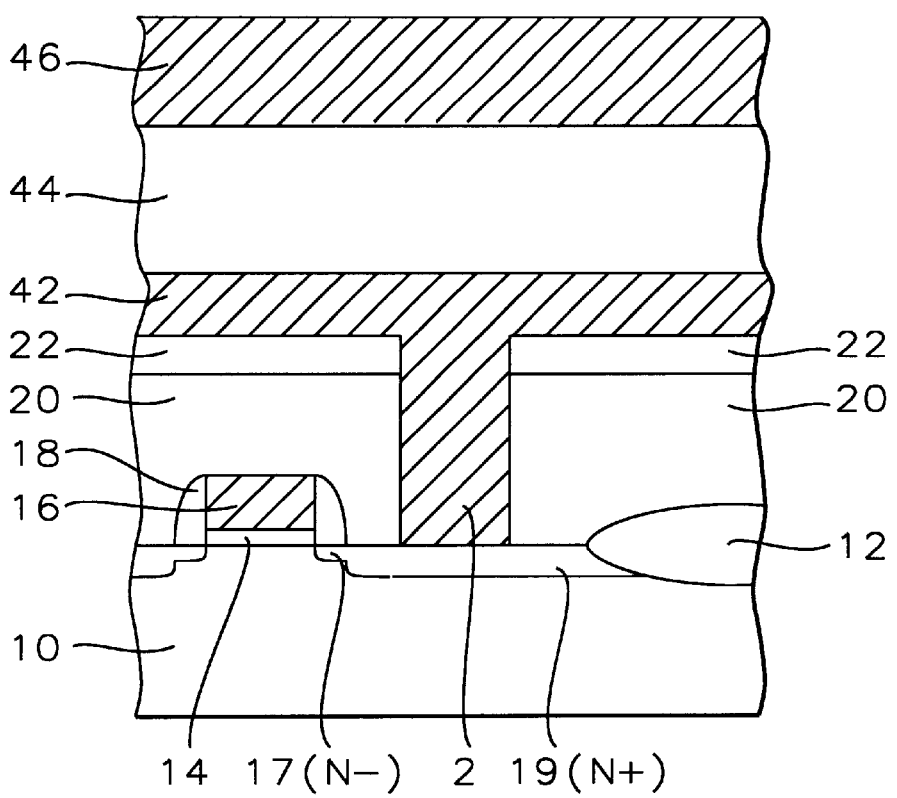

Referring to FIG. 8, a second insulating layer 44 is deposited on the planar surface of the first polysilicon layer 42. Layer 44 is preferably a $SiO_2$, and is deposited by LPCVD using a reactant gas such as TEOS. Alternatively, layer 44 can be a BPSG by doping the TEOS with a boron and phosphorus during the deposition. The second insulating layer 44 is deposited to a preferred thickness of between about 4000 and 10000 Angstroms. A photoresist mask 46 and anisotropic plasma etching are used to pattern the second insulating layer 44, leaving portions of the $SiO_2$ layer 44 aligned over the node contacts 2, as shown in FIG. 9, while exposing the first polysilicon layer 42 elsewhere on the substrate.

The portions of the $SiO_2$ layer 44 have a cylindrical shape and provide a template for making the double-cylinder-shaped stacked capacitors.

Figure 9:
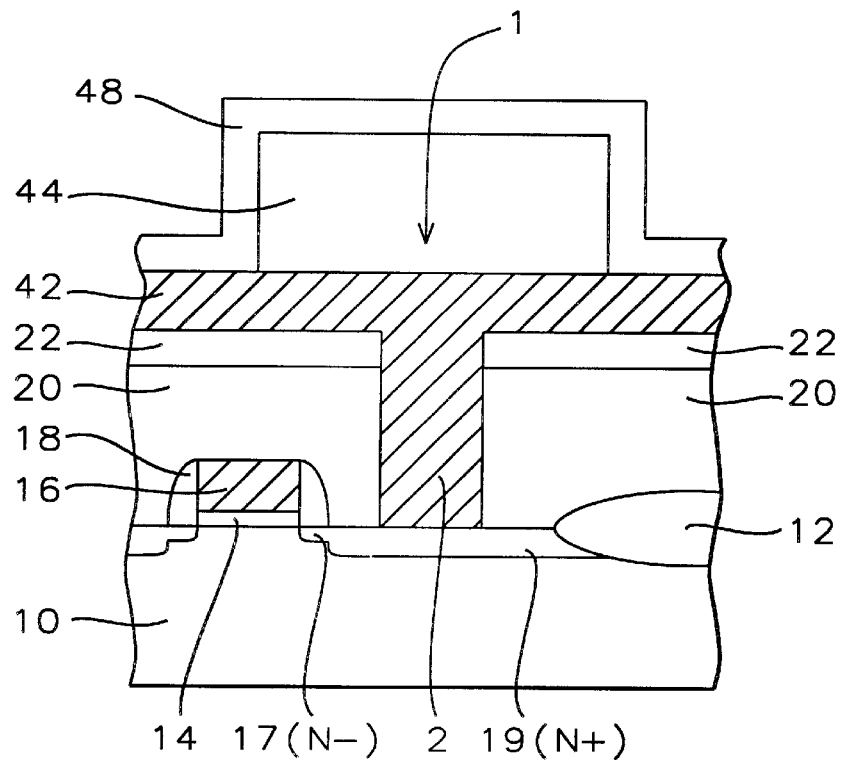

As shown in FIG. 9, an important feature of this invention is that even if the patterned $SiO_2$ layer 44 is misaligned over the node contacts 2, the first polysilicon layer 42 prevents overetching the underlying $SiO_2$ first insulating layer 20 in the node contact openings 1, as would otherwise occur in the process sequence of the prior art (shown FIGS. 1–4).

Still referring to FIG. 9, after removing the photoresist mask 46, for example by plasma ashing in oxygen, a conformal second $Si_3N_4$ layer 48 is deposited over the patterned second insulating layer 44. The second $Si_3N_4$ layer 48 is deposited by LPCVD using a reactant gas such as $SiCl_2H_2$ and $NH_3$, and is deposited to a preferred thickness of between about 100 and 1000 Angstroms.

Figure 10:
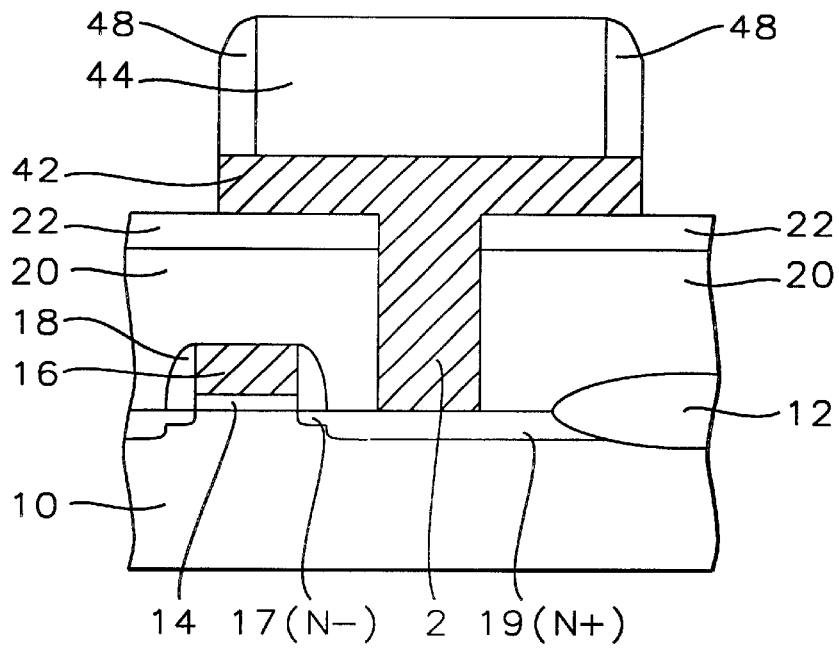

Referring to FIG. 10, the second $Si_3N_4$ layer 48 is anisotropically etched back to form $Si_3N_4$ sidewall spacers 48 on the sidewalls of the patterned second insulating layer 44. The etching is continued to remove selectively the first polysilicon layer 42 down to the first $Si_3N_4$ layer 22. The etching of the second $Si_3N_4$ layer 48 is preferably carried out in a HDP etcher or reactive ion etcher (RIE) using an etchant gas containing fluorine as commonly used in the industry, and the first polysilicon layer 42 is preferably etched in a HDP or RIE using an etchant gas containing chlorine commonly used in the industry.

Figure 11:
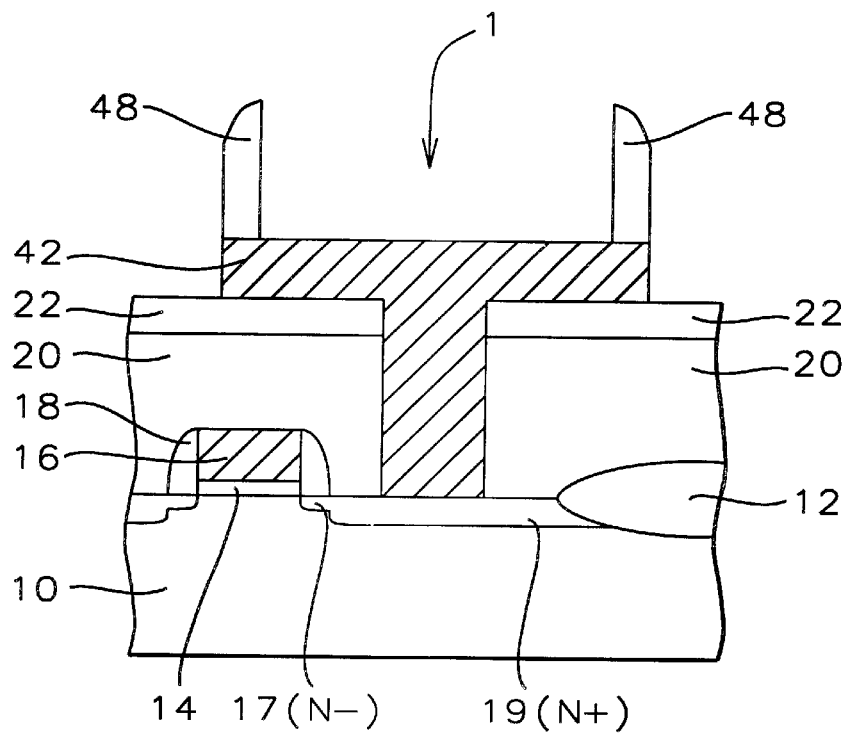

Referring now to FIG. 11, the exposed portions of the second insulating layer 44 are then selectively removed in a hydrofluoric acid etch to leave free-standing $Si_3N_4$ sidewall spacers 48, while the first $Si_3N_4$ layer 22 protects the $SiO_2$ first insulating layer 20 from etching. Also, the first polysilicon layer 42 protects the $SiO_2$ layer 20 from being etched in the node contact openings 1.

Figure 12:
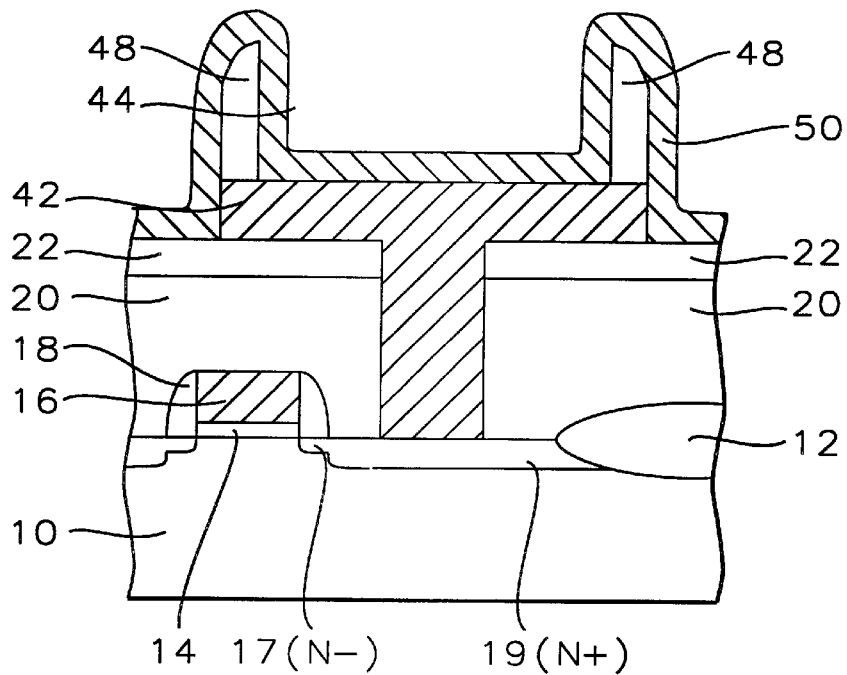

Referring to FIG. 12, a conformal doped second polysilicon layer 50 is deposited over the $Si_3N_4$ sidewall spacers 48. Preferably the second polysilicon layer 50 is deposited by LPCVD using for example, $SiH_4$ as the reactant gas, and is in-situ doped with phosphorus by including phosphine during the deposition, and is doped to a concentration of between about 1.0 E 19 and 1.0 E 21 atoms/cm$^3$. The second polysilicon layer 50 is deposited to a preferred thickness of between about 500 and 2000 Angstroms.

Figure 13:
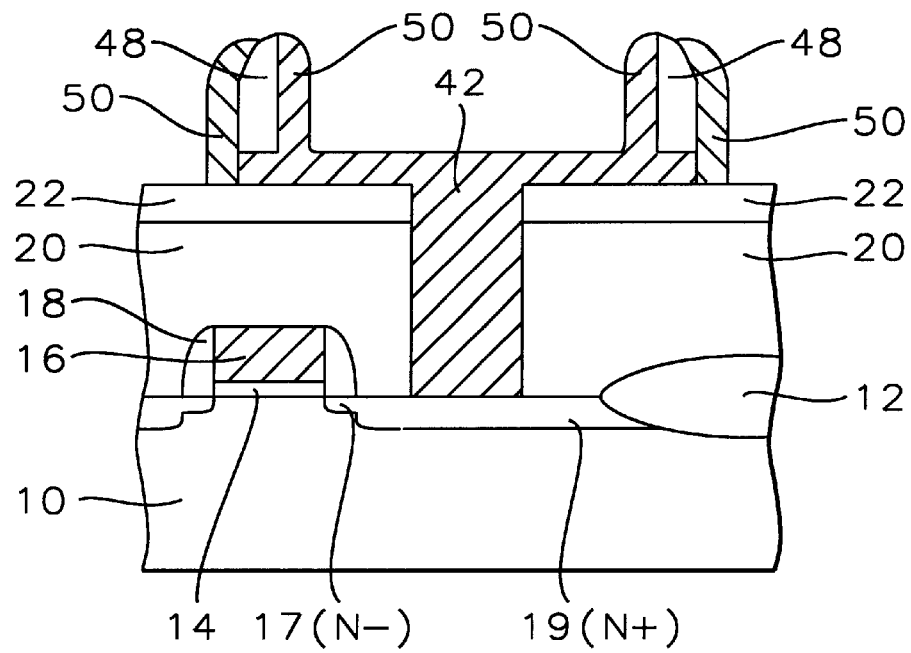

Referring to FIG. 13, the second polysilicon layer 50 is anisotropically etching back to form double-cylinder-shaped polysilicon sidewalls 50, one on each side of the $Si_3N_4$ sidewall spacers 48, while exposing the top surface of the $Si_3N_4$ sidewall spacers 48. The etching is preferably carried out in a HDP etcher or RIE using a chlorine-containing etchant gas commonly used in the industry. The polysilicon sidewalls 50 contact the patterned first polysilicon layer 42 to form the bottom electrodes having the node contacts 2 for the storage capacitors.

Figure 14:
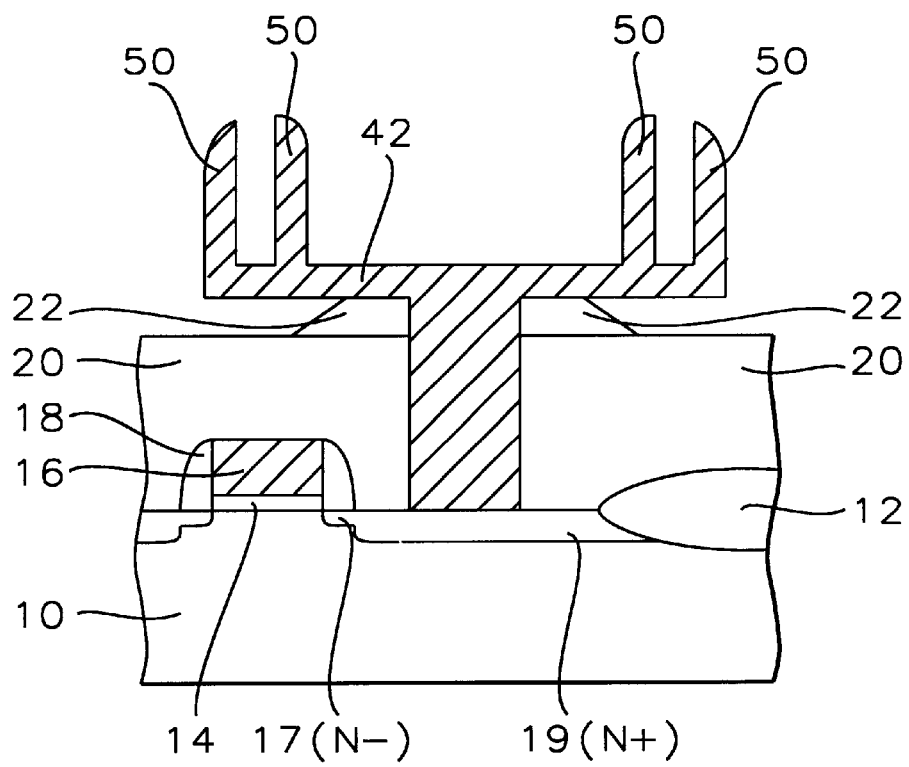

Referring to FIG. 14, the second and first $Si_3N_4$ layers 48 and 22 are selectively removed by etching in a hot phosphoric acid ($H_3PO_4$) to form free-standing capacitor bottom electrodes, formed from the second and first polysilicon layers 50 and 42, and having double-cylindrical sidewalls for increased capacitance. The etching can be carried out to retain a portion of the first $Si_3N_4$ layer 22 under the polysilicon bottom electrodes (layer 42) to provide additional structural support. Partial removal of the $Si_3N_4$ layer 22 under the bottom electrodes further increases the capacitance.

Figure 15:
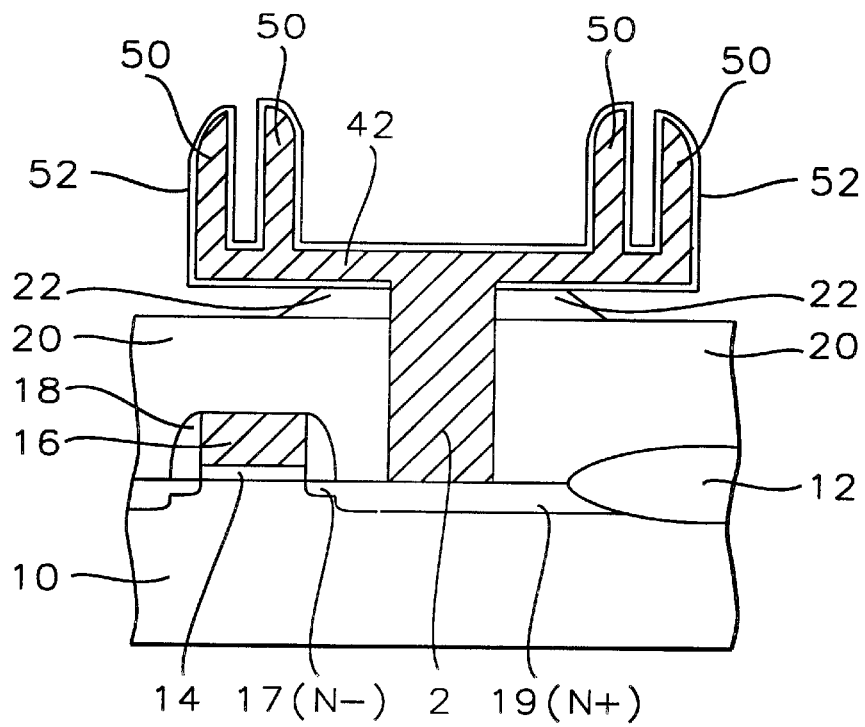

As shown in FIG. 15, the DRAM cylindrical capacitors are now completed by depositing an interelectrode dielectric layer 52 on the polysilicon bottom electrodes formed layers 50 and 42, and forming the capacitor top electrodes by depositing and patterning a third polysilicon layer 54. The interelectrode dielectric layer 52 is formed on the surface of the bottom electrodes by depositing a thin high-dielectric constant insulating material. The dielectric layer 52 is preferably between about 35 and 75 Angstroms thick, and is composed of a material that is compatible with the polysilicon processing, and is continuous and pin-hole free. The preferred interelectrode dielectric layer 52 is composed of silicon oxide-silicon nitride (ON) or a silicon oxide-silicon nitride-silicon oxide (ONO) layer. For example, the surface of the polysilicon bottom electrode (composed of polysilicon layers 50 and 42) can be thermally oxidized to form the SiO$_2$, and then a thin conformal Si$_3$N$_4$ layer can be deposited using LPCVD to form the ON layer. To form the ONO layer, the exposed surface of the Si$_3$N$_4$ layer can then be reduced in an oxidizing ambient at elevated temperatures. Additionally, the surface of the polysilicon bottom electrodes can be roughened to further increase the surface area and the capacitance. Other high-dielectric constant insulators can also be used, such as tantalum pentoxide (Ta$_2$O$_5$) and the like.

Figure 16:
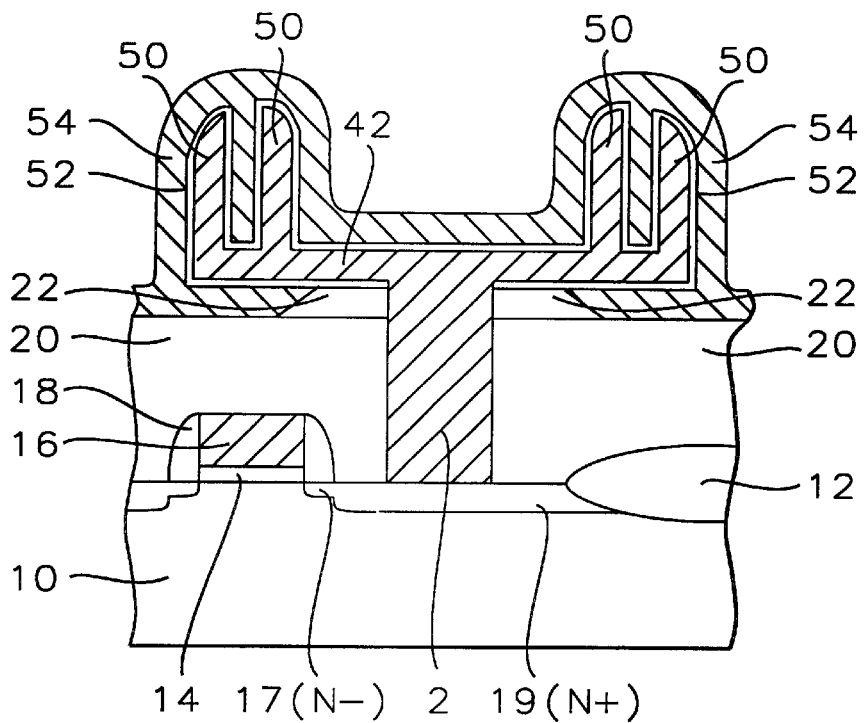

Referring to FIG. 16, the third polysilicon layer 54 is deposited over the interelectrode dielectric layer 52, and is then patterned using conventional photolithographic and plasma etching techniques to form the top electrodes 54. The third polysilicon layer 54 is preferably deposited by LPCVD to a thickness of between about 500 and 2000 Angstroms, and is in-situ doped with an N-type dopant, such as phosphorous (P), having a preferred concentration in the range of between about 1.0 E 19 and 1.0 E 21 atoms/cm$^3$.

While the invention has been particularly shown and described with reference to the preferred embodiment thereof, it will be understood by those skilled in the art that various changes in form and detail may be made without departing from the spirit and scope of the invention.

What is claimed is:

1. A method for fabricating double-cylinder-shaped stacked capacitors for memory devices comprising the steps of:

providing a semiconductor substrate having device areas with semiconductor devices;

forming a planar first insulating layer over said device areas on said substrate;

depositing a first silicon nitride layer on said first insulating layer;

selectively etching openings for capacitor node contacts in said first silicon nitride layer and in said first insulating layer to said device areas;

depositing a conductively doped first polysilicon layer sufficiently thick to fill said openings and to form a planar surface over said openings;

depositing a second insulating layer on said first polysilicon layer;

using a photoresist mask and anisotropic plasma etching to pattern said second insulating layer and leaving portions aligned over said openings for said capacitor node contacts and exposing said first polysilicon layer elsewhere on said substrate;

depositing a conformal second silicon nitride layer over said patterned second insulating layer;

anisotropically etching back said second silicon nitride layer to form sidewall spacers on said patterned second insulating layer, and continuing said etching to remove said first polysilicon layer exposed elsewhere on said substrate;

removing selectively said patterned second insulating layer to leave free-standing silicon nitride sidewall spacers, while said first silicon nitride layer protects said first insulating layer from etching;

depositing a conformal second polysilicon layer and anisotropically etching back to form double-cylinder-shaped polysilicon sidewalls, one on each side of said silicon nitride sidewall spacers;

removing selectively said second and said first silicon nitride layers to form free-standing capacitor bottom electrodes formed from said second and first polysilicon layers, and further removing said first silicon nitride layer under said bottom electrodes to increase capacitance;

depositing an interelectrode dielectric layer on said capacitor bottom electrodes;

depositing and patterning a third polysilicon layer to form top electrodes and completing said double-cylinder-shaped stacked capacitors.

2. The method of claim 1, wherein said first insulating layer is silicon oxide, and has a thickness of between about 4000 and 6000 Angstroms after planarizing.

3. The method of claim 1, wherein said first silicon nitride layer is deposited to a thickness of between about 100 and 300 Angstroms.

4. The method of claim 1, wherein said first polysilicon layer is doped with conductive impurities to a concentration of between about 1.0 E 17 and 1.0 E 21 atoms/cm$^3$, and is deposited to a thickness of between about 1000 and 3000 Angstroms.

5. The method of claim 1, wherein said second insulating layer is silicon oxide and has a thickness of between about 4000 and 10000 Angstroms.

6. The method of claim 1, wherein said second silicon nitride layer is deposited to a thickness of between about 100 and 1000 Angstroms.

7. The method of claim 1, wherein said second insulating layer is selectively removed using a hydrofluoric acid solution.

8. The method of claim 1, wherein said second polysilicon layer is conductively doped in-situ to a concentration of between about 1.0 E 19 and 1.0 E 21 atoms/cm$^3$, and is deposited to a thickness of between about 500 and 2000 Angstroms.

9. The method of claim 1, wherein said first and second silicon nitride layers are selectively removed in a hot phosphoric acid etch.

10. The method of claim 1, wherein said interelectrode dielectric layer is silicon oxide/silicon nitride/silicon oxide (ONO), and has a thickness of between about 35 and 75 Angstroms.

11. The method of claim 1, wherein said third polysilicon layer is doped with conductive impurities to a concentration of between about 1.0 E 19 and 1.0 E 21 atoms/cm$^3$, and has a thickness of between about 500 and 2000 Angstroms.

12. A method for fabricating dynamic random access memory (DRAM) cells having double-cylinder-shaped stacked capacitors comprising the steps of:

providing a semiconductor substrate having device areas surrounded and electrically isolated by field oxide areas, each of said device areas having one field effect transistor with a first and second source/drain area, where said first source/drain area is provided for bit line contacts and said stacked capacitors are formed to said second source/drain area by;

forming a planar first insulating layer over said device areas on said substrate;

depositing a first silicon nitride layer on said first insulating layer;

selectively etching openings for capacitor node contacts in said first silicon nitride layer and in said first insulating layer to said device areas;

depositing a conductively doped first polysilicon layer sufficiently thick to fill said openings and to form a planar surface over said openings;

depositing a second insulating layer on said first polysilicon layer;

using a photoresist mask and anisotropic plasma etching to pattern said second insulating layer and leaving portions aligned over said openings for said capacitor node contacts and exposing said first polysilicon layer elsewhere on said substrate;

depositing a conformal second silicon nitride layer over said patterned second insulating layer;

anisotropically etching back said second silicon nitride layer to form sidewall spacers on said patterned second insulating layer, and continuing said etching to remove said first polysilicon layer exposed elsewhere on said substrate;

removing selectively said patterned second insulating layer to leave freestanding silicon nitride sidewall spacers, while said first silicon nitride layer protects said first insulating layer from etching;

depositing a conformal second polysilicon layer and anisotropically etching back to form double-cylinder-shaped polysilicon sidewalls, one on each side of said silicon nitride sidewall spacers;

removing selectively said second and said first silicon nitride layers to form free-standing capacitor bottom electrodes formed from said second and first polysilicon layers, and further removing said first silicon nitride layer under said bottom electrodes to increase capacitance;

depositing an interelectrode dielectric layer on said capacitor bottom electrodes;

depositing and patterning a third polysilicon layer to form top electrodes for said double-cylinder-shaped stacked capacitors and completing said DRAM cells.

13. The method of claim 12, wherein said first insulating layer is silicon oxide, and has a thickness of between about 4000 and 6000 Angstroms after planarizing.

14. The method of claim 12, wherein said first silicon nitride layer is deposited to a thickness of between about 100 and 300 Angstroms.

15. The method of claim 12, wherein said first polysilicon layer is doped with conductive impurities to a concentration of between about 1.0 E 17 and 1.0 E 21 atoms/cm$^3$, and is deposited to a thickness of between about 1000 and 3000 Angstroms.

16. The method of claim 12, wherein said second insulating layer is silicon oxide and has a thickness of between about 4000 and 10000 Angstroms.

17. The method of claim 12, wherein said second silicon nitride layer is deposited to a thickness of between about 100 and 1000 Angstroms.

18. The method of claim 12, wherein said second insulating layer is selectively removed using a hydrofluoric acid solution.

19. The method of claim 12, wherein said second polysilicon layer is conductively doped in-situ to a concentration of between about 1.0 E 19 and 1.0 E 21 atoms/cm$^3$, and is deposited to a thickness of between about 500 and 2000 Angstroms.

20. The method of claim 12, wherein said first and second silicon nitride layers are selectively removed in a hot phosphoric acid etch.

21. The method of claim 12, wherein said interelectrode dielectric layer is silicon oxide/silicon nitride/silicon oxide (ONO), and has a thickness of between about 35 and 75 Angstroms.

22. The method of claim 12, wherein said third polysilicon layer is doped with conductive impurities to a concentration of between about 1.0 E 19 and 1.0 E 21 atoms/cm$^3$, and has a thickness of between about 500 and 2000 Angstroms.

* * * * *